United States Patent
Wang et al.

(10) Patent No.: US 8,363,454 B2
(45) Date of Patent: Jan. 29, 2013

(54) SRAM BIT CELL

(75) Inventors: Ping Wang, Hsin-Chu (TW); Hung-Jen Liao, Hsin-Chu (TW); Yen-Huei Chen, Jhudong (TW); Jihi-Yu Lin, Taichung (TW); Shao-Yu Chou, Chu Pei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 190 days.

(21) Appl. No.: 13/015,773

(22) Filed: Jan. 28, 2011

(65) Prior Publication Data

US 2012/0195105 A1   Aug. 2, 2012

(51) Int. Cl.
*G11C 11/00* (2006.01)
(52) U.S. Cl. .............. 365/154; 365/185; 365/63
(58) Field of Classification Search .......... 365/154, 365/185, 63
See application file for complete search history.

(56) References Cited

U.S. PATENT DOCUMENTS

| | | | | |
|---|---|---|---|---|
| 5,757,696 A | * | 5/1998 | Matsuo et al. | 365/185.07 |
| 5,812,445 A | * | 9/1998 | Yamauchi | 365/154 |
| 7,227,798 B2 | * | 6/2007 | Gupta et al. | 365/205 |
| 7,397,286 B2 | * | 7/2008 | Miyamoto | 327/57 |
| 2002/0075727 A1 | * | 6/2002 | Jeong et al. | 365/185.28 |

* cited by examiner

*Primary Examiner* — Tuan T. Nguyen
(74) *Attorney, Agent, or Firm* — Duane Morris LLP

(57) ABSTRACT

A semiconductor memory bit cell includes an inverter latch including a pair of cross-coupled inverters. A first transistor has a gate coupled to a first control line and a source coupled to the inverter latch, and a second transistor has a gate coupled to a second control line and a drain coupled to the drain of the first transistor at a first node. A third transistor has a source coupled to the first node and a gate coupled to a word line, and a fourth transistor has a gate coupled to a source of the second transistor and to the inverter latch. A fifth transistor has a gate coupled to the word line and a drain coupled to a read bit line.

20 Claims, 16 Drawing Sheets

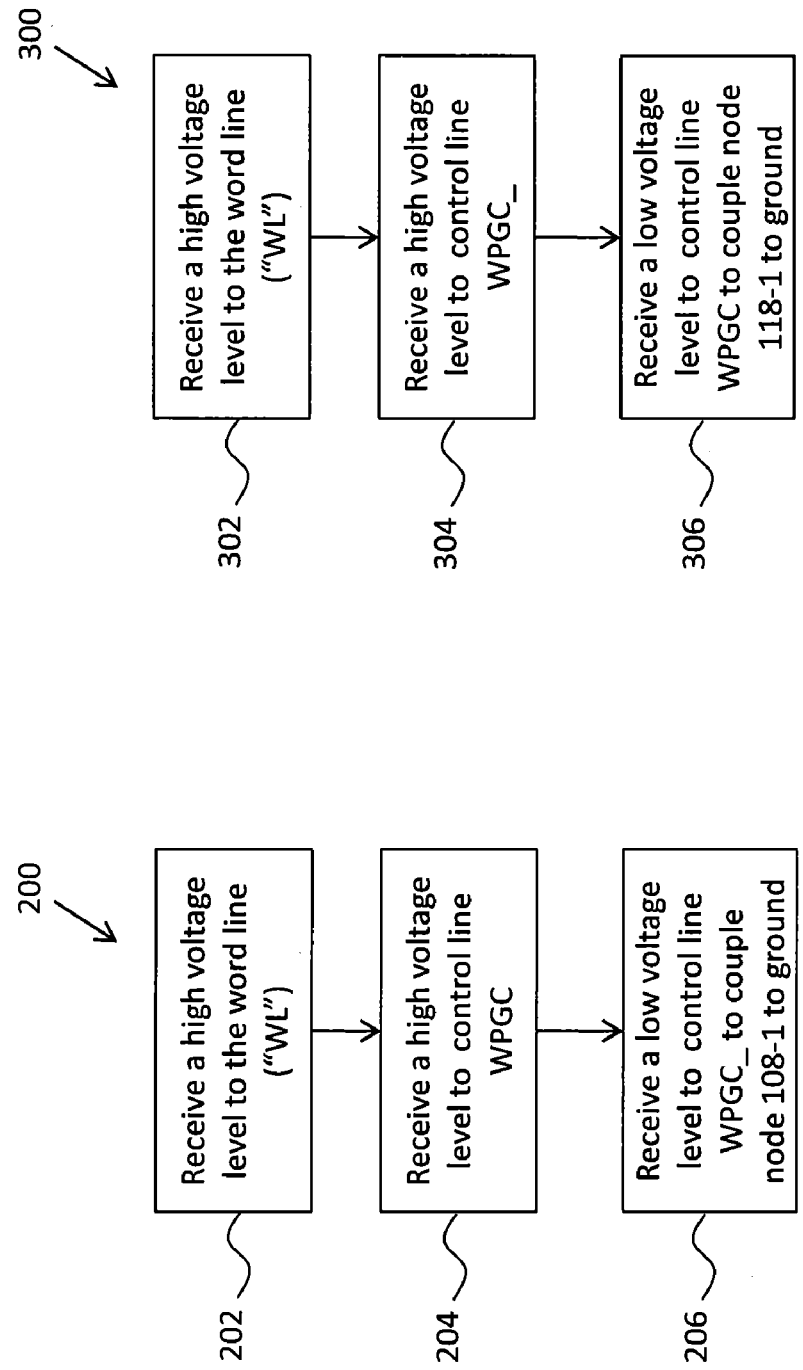

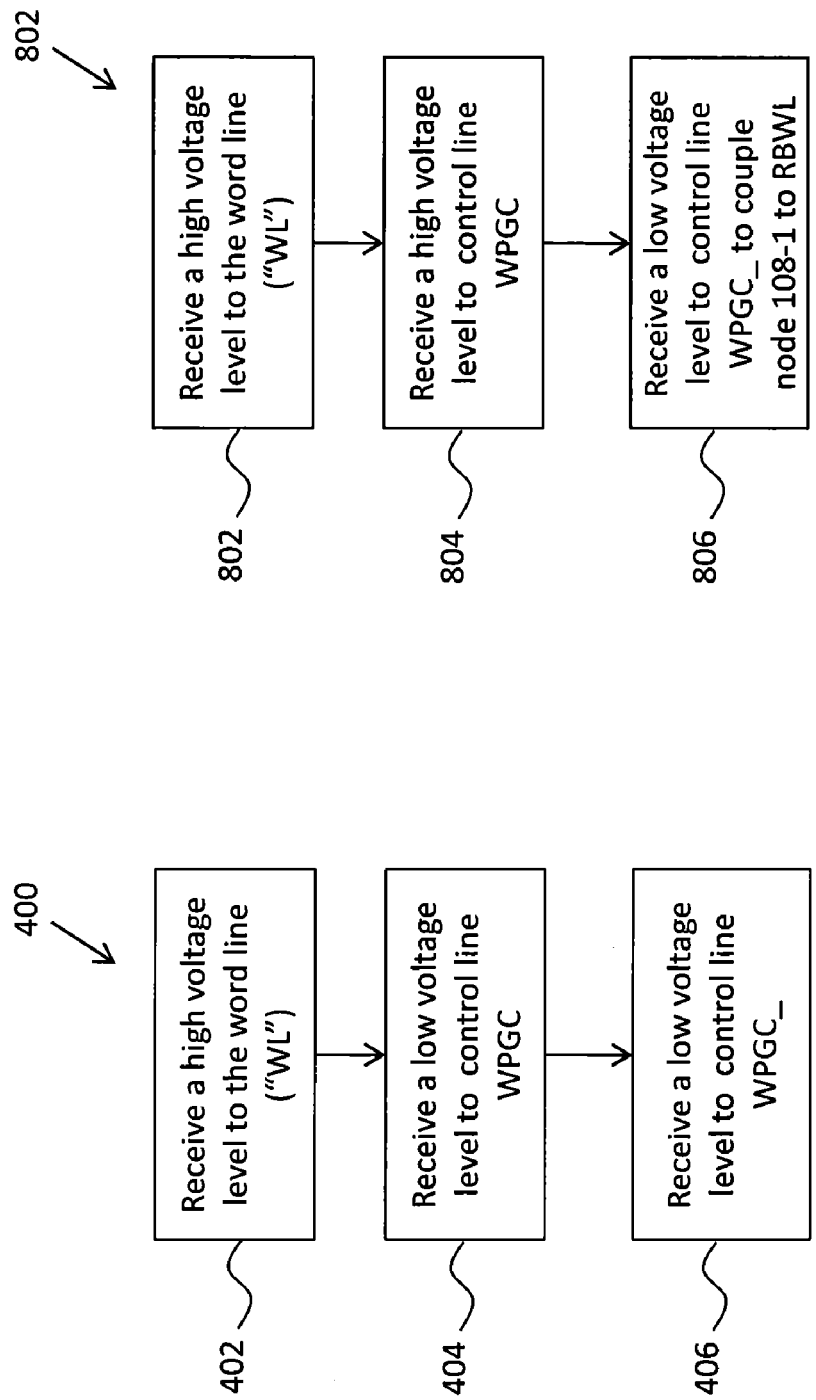

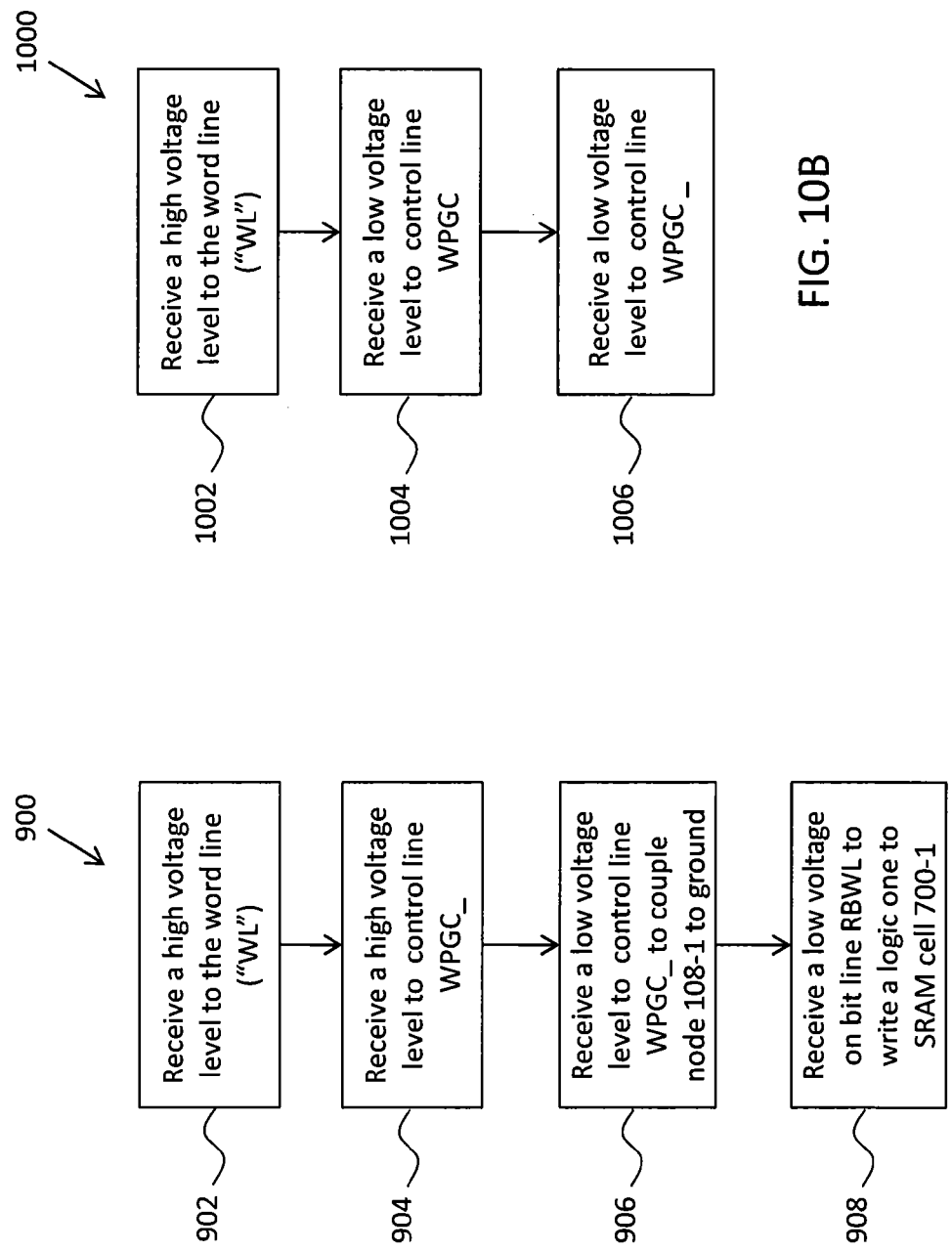

US 8,363,454 B2

SRAM BIT CELL

FIELD OF DISCLOSURE

The disclosed circuit and method relate to integrated circuit memories. More specifically, the disclosed circuit and method relate to bit cells for integrated circuit memories.

BACKGROUND

Static random access memories ("SRAM") include a plurality of cells disposed in rows and columns to form an array. Conventional SRAM cells include a plurality of transistors coupled to bit lines and word lines that are used to read and write a bit of data to the memory cell. However, conventional SRAM cells suffer from half-select disturbance in which all the cells on the same row, which is controlled by a common word line, are simultaneously activated when only a cell in a single column is to be accessed (i.e., data being read from or written to the cell). The half-select disturbance may result in data corruption of the cells not being accessed due to their half-selection (i.e., the word line to which they are coupled being set to a logic "1" or "high"). Additionally, conventional SRAM cells typically exhibit poor current performance during $V_{CCmin}$ operation (the operation of the SRAM under the lowest possible voltage under which the SRAM may reliably be operated).

BRIEF DESCRIPTION OF THE DRAWINGS

FIG. 2B is a flow chart illustrating one example of the read operation in accordance with FIG. 2A.

FIG. 3B illustrates a flow chart of one example of a method of performing a read operation in accordance with FIG. 3A.

FIG. 4B is a flow chart illustrating one example of a method of performing a write operation in accordance with FIG. 4A.

FIG. 8B is a flow chart illustrating one example of the read operation in accordance with FIG. 8A.

FIG. 9B illustrates a flow chart of one example of a method of performing a read operation in accordance with FIG. 9A.

FIG. 10B is a flow chart illustrating one example of a method of performing a write operation in accordance with FIG. 10A.

DETAILED DESCRIPTION

The improved SRAM cells disclosed herein exhibit improved current performance and operating speed compared to conventional SRAM cells even during $V_{CCmin}$ operation. Additionally, the improved SRAM cells do not suffer from half-selected disturbance as do conventional SRAM cells.

Figure 1A:
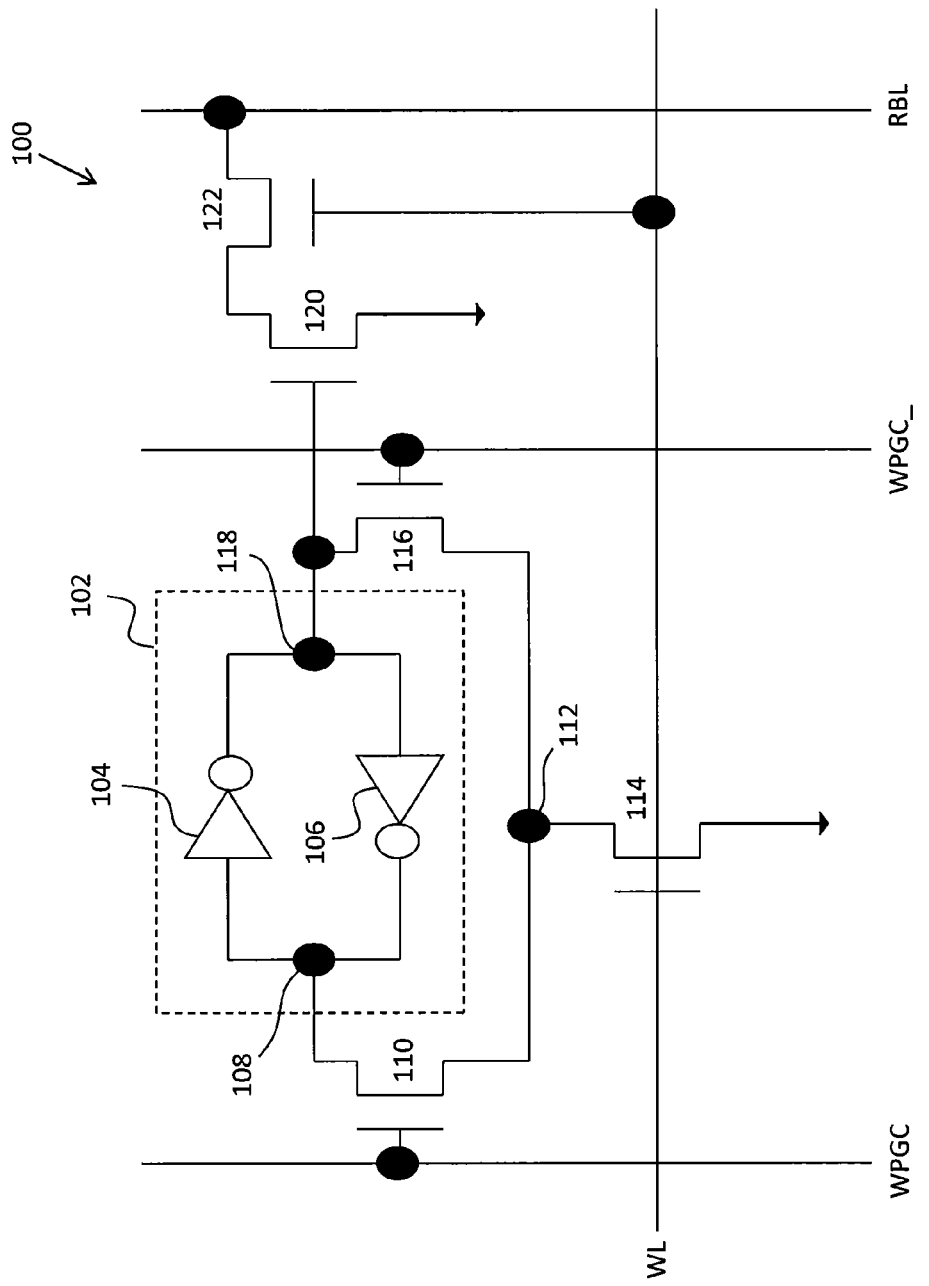
FIG. 1A illustrates one example of an improved SRAM memory cell.
Figure 1B:
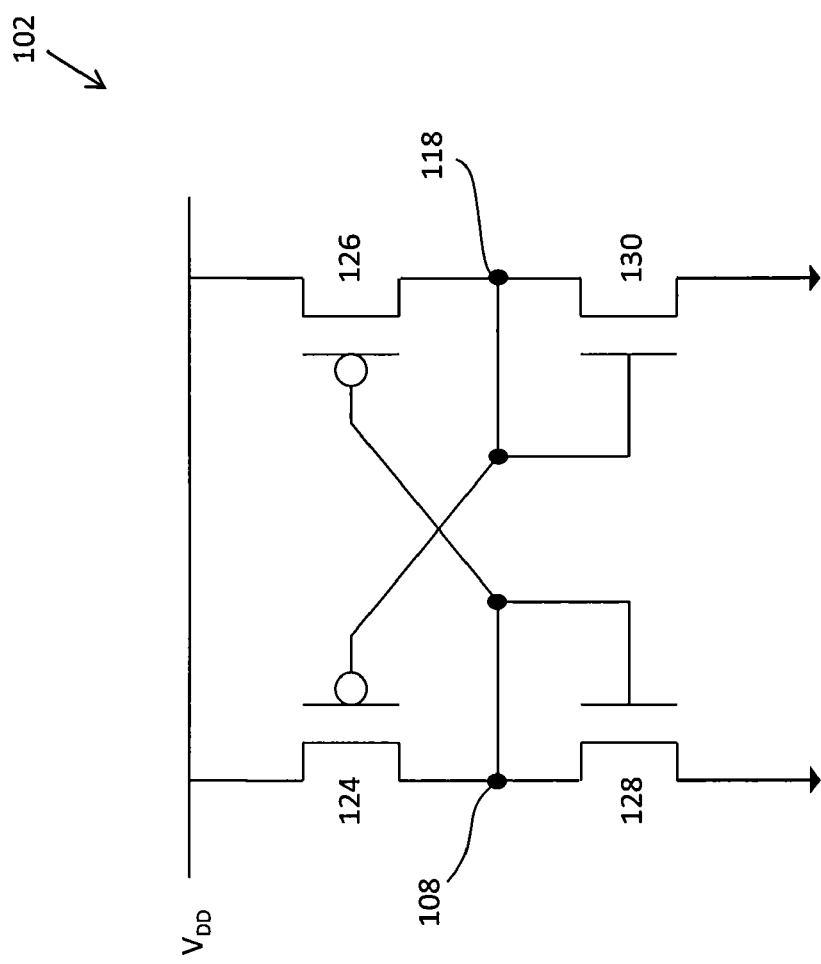
FIG. 1B illustrates one example of the inverter latch in accordance with the SRAM memory cell illustrated in FIG. 1A.

FIG. 1A illustrates one example of an improved SRAM bit cell 100 comprising a latch 102 for storing a data bit. Latch 102 includes a pair of cross-coupled inverters 104, 106 with each inverter 104, 106 including a pair of complementary metal-oxide semiconductor ("CMOS") transistors as illustrated in FIG. 1B. As shown in FIG. 1B, latch 102 includes two p-type transistors (e.g., PMOS transistors) 124, 126 and two n-type transistors (e.g., NMOS transistors) 128, 130. The gate of transistor 124 is coupled to the gate of transistor 130 and to node 118, which is coupled to the drain of transistor 126 and to the source of transistor 130. The gate of transistor 126 is coupled to the gate of transistor 128 and to node 108, which is disposed between the drain of transistor 124 and the source of transistor 128. The sources of transistors 124 and 126 are coupled to the operating voltage, $V_{DD}$, and the drains of transistors 128 and 130 are coupled to ground.

Referring again to FIG. 1A, node 108 is coupled to the input of inverter 104, to the output of inverter 106, and to the source of transistor 110. Transistor 110 is a write-pass gate and has its gate coupled to write pass gate control line, WPGC, which controls the selective coupling of the source of pass gate 110 to the drain of pass gate 110 for coupling node 108 to node 112. Node 112 is coupled to the source of transistor 114, which has its drain coupled to ground, and to the drain of transistor 116.

Transistor 116 is also a write pass gate having its source coupled to node 118 and its gate coupled to write pass gate control line, WPGC_. Node 118 is coupled to the output of inverter 104, to the input of inverter 106, and to the gate of transistor 120. Transistor 120 is a read pull down transistor having its drain coupled to ground and its source coupled to the drain of read pass gate transistor 122. Transistor 122 has its gate coupled to the word line, WL, and its source coupled to the read bit line, RBL.

Figure 2A:
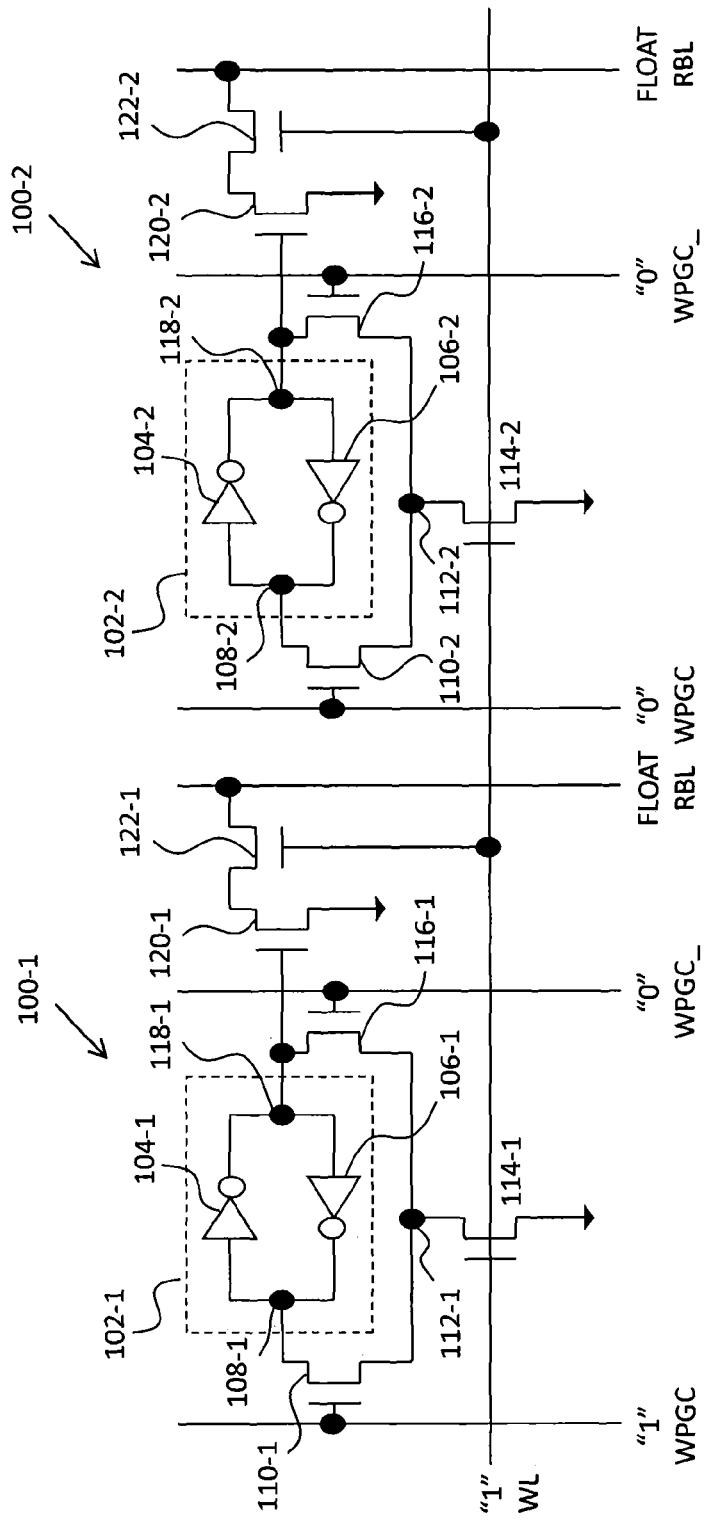
FIG. 2A illustrates an SRAM memory cell in accordance with FIG. 1 during a read operation.

The writing of a logic "0" to SRAM cell 100-1 is illustrated in FIG. 2A, which illustrates a pair of SRAM cells 100-1, 100-2 disposed adjacent to one another, and is described with reference to FIG. 2B, which is a flow chart illustrating one example of a method 200 for writing a zero to an SRAM cell 100. As shown in FIGS. 2A and 2B, a write operation is performed by setting line WL to a logic "1" or "high" at block 202, setting a logic one or high to line WPGC at block 204, and setting line WPGC_ to a logic "0" or low at block 206. With line WPGC receiving a high signal, transistor 110-1 is turned from a non-current conducting or "off" state to a current conducting or "on" state, and a high signal received on line WL turns transistor 114-1 into a current conducting state such that node 108 is coupled to ground through transistors 110-1 and 114-1. While lines WPGC and WL are high, line WPGC_ receives a low signal to turn transistor 116-1 into a non-current conducting state to isolate node 118-1 from the writing of a logic zero into node 108.

As node 108-1 is set to a low voltage, SRAM cell 100-2 may be completely isolated to avoid half-selection disturbance. To isolate SRAM cell 100-2, lines WPGC and WPGC_ are logic low such that transistors 110-2 and 116-2 are in an off state. With transistors 110-2 and 116-2 off, latch 102-2 is isolated from ground and RBL thereby preventing half-selection disturbance.

Figure 3A:
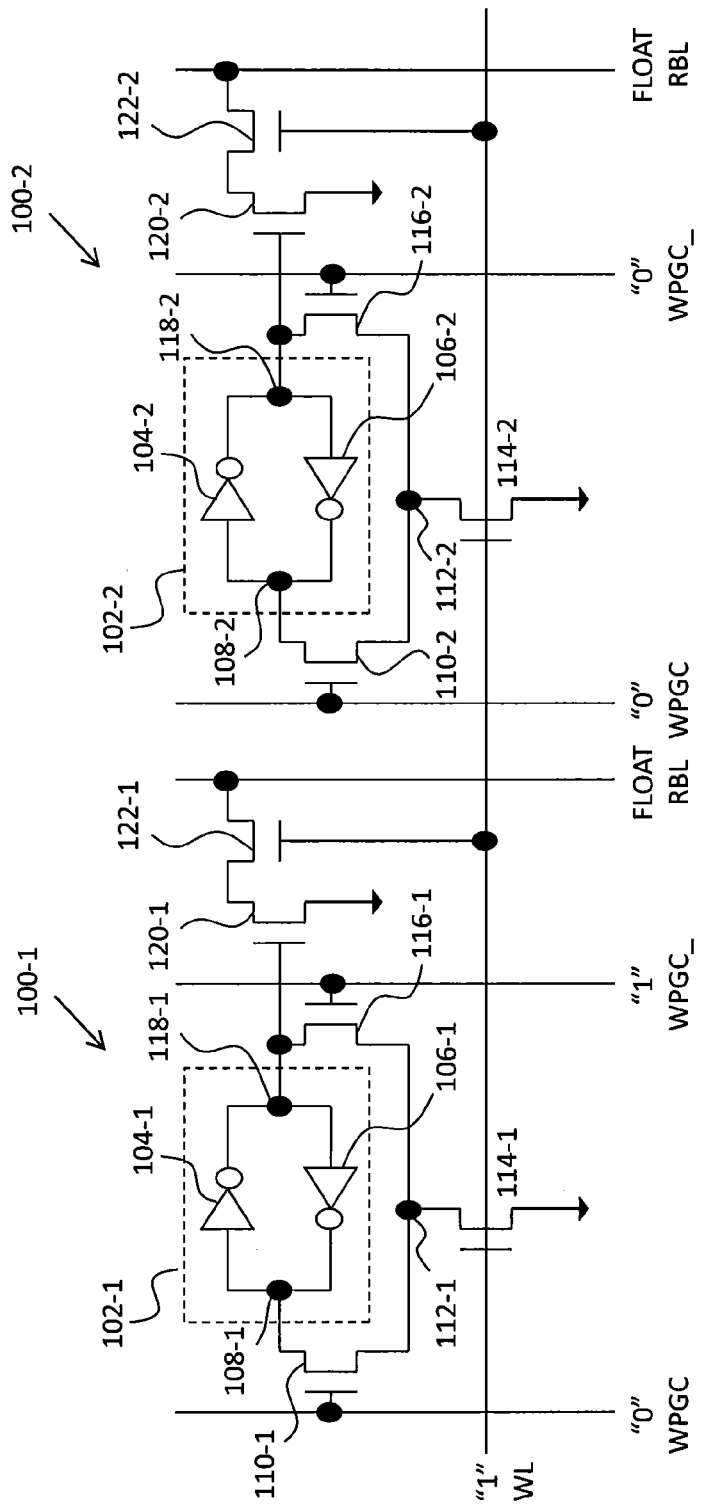
FIG. 3A illustrates an SRAM memory cell in accordance with FIG. 1 during another read operation.

To write a logic one to node 108-1 of inverter SRAM cell 100-1, WL is set to a logic one at block 302, control line WPGC_ is set to logic one at block 304, and control line WPGC is set at logic zero at block 306 as illustrated in FIGS. 3A and 3B in which FIG. 3B is a flow diagram of one example of a method 300 of writing a logic one to SRAM cell 100. Line WPGC_ being high turns on transistor 116-1, and WL being high turns on transistor 114-1 such that node 118-1 is coupled to ground through transistors 114-1 and 116-1. Line WPGC being logic low zero turns off transistor 110-1 such that node 108-1 is not pulled low during the writing of a logic one to node 118-1. Instead, node 108-1 transitions to a logic one as node 118-1 transitions to a logic zero through inverter 106-1.

As a logic one is being written to node 108-1 of SRAM cell 100-1, SRAM cell 100-2 is isolated by setting lines WPGC and WPGC_ that are connected to SRAM cell 100-2 to logic zeroes. Logic zeroes on lines WPGC and WPGC_ turns off transistors 110-2 and 116-2 to thereby isolating nodes 108-2 and 118-2 of SRAM cell 100-2 and preventing half-selection disruption.

Figure 4A:
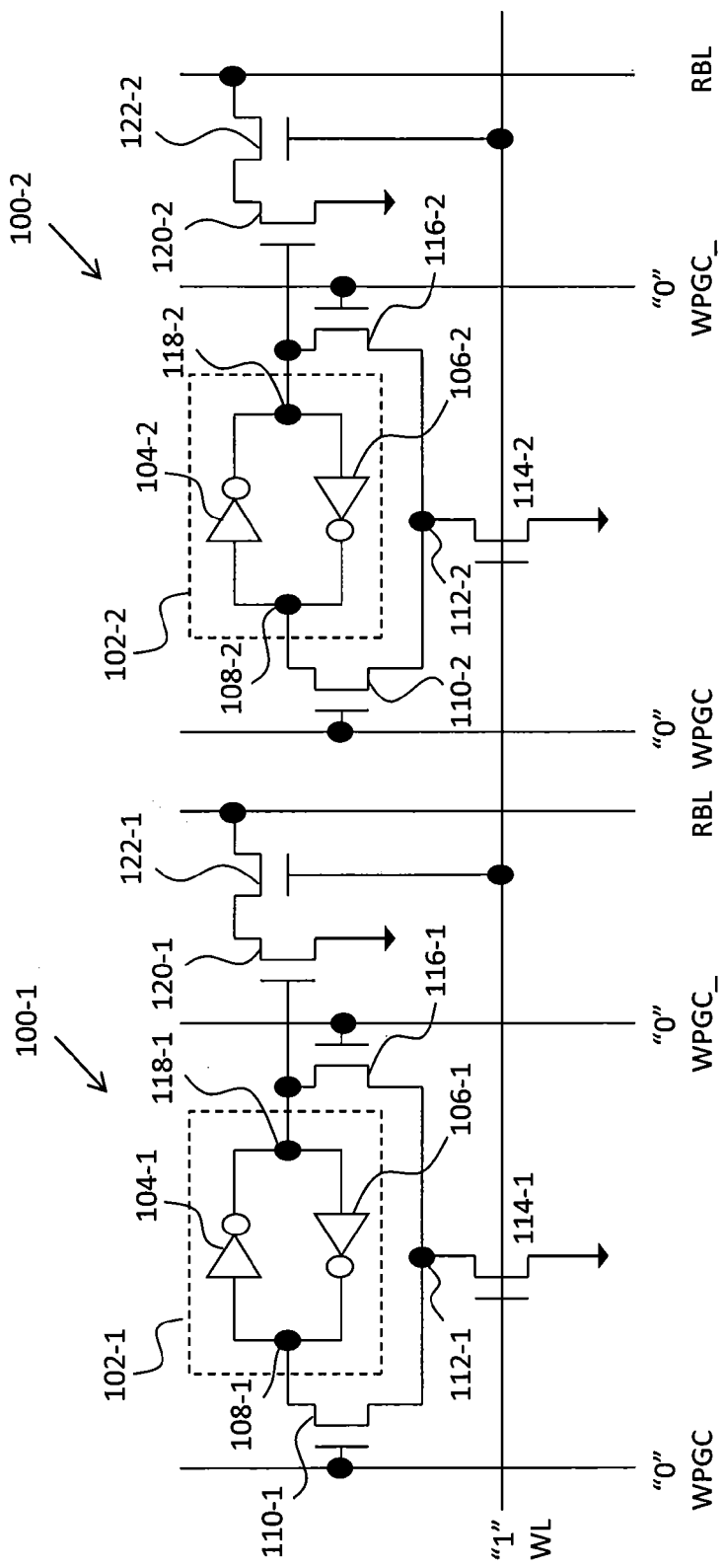
FIG. 4A illustrates an SRAM memory cell in accordance with FIG. 1 during a write operation.

A reading of a logic zero from node 108 to RBL is described with reference to FIGS. 4A and 4B. As shown in FIGS. 4A and 4B, WL is set to a logic high at block 402, which turns on transistors 122-1, 122-2 (collectively referred to as "transistors 122") due to a high signal at their respective gates. At blocks 404 and 406, control lines WPGC and WPGC_ are set to logic zeroes, respectively. Low signals on lines WPGC and WPGC_ turns off transistors 110-1, 110-2 and 116-1, 116-2 to isolate latches 102-1, 102-2. With logic zeroes stored at nodes 108-1 and 108-2, nodes 118-1 and 118-2 have a voltage potential of logic ones due to inverters 104-1 and 104-2. The logic ones at nodes 118-1 and 118-2, which are respectively coupled to the gates of transistors 120-1 and 120-2, turns on transistors 120-1 and 120-2 (collectively referred to as "transistors 120"). RBL is coupled to ground with transistors 120 and 122 in an on state such that a logic zero will develop on RBL and be "read" from inverter latches 102-1 and 102-2.

If logic one's are stored at nodes 108-1 and 108-2, nodes 118-1 and 118-2 have a voltage potential of logic zero due to inverters 104-1 and 104-2. The logic zeroes at nodes 118-1 and 118-2, which are respectively coupled to the gates of transistors 120-1 and 120-2, turns off transistors 120. RBL is pre-charged to a logic high (e.g., VDD) and will remain high whenever WL is high or low to read a logic one.

Figure 5:
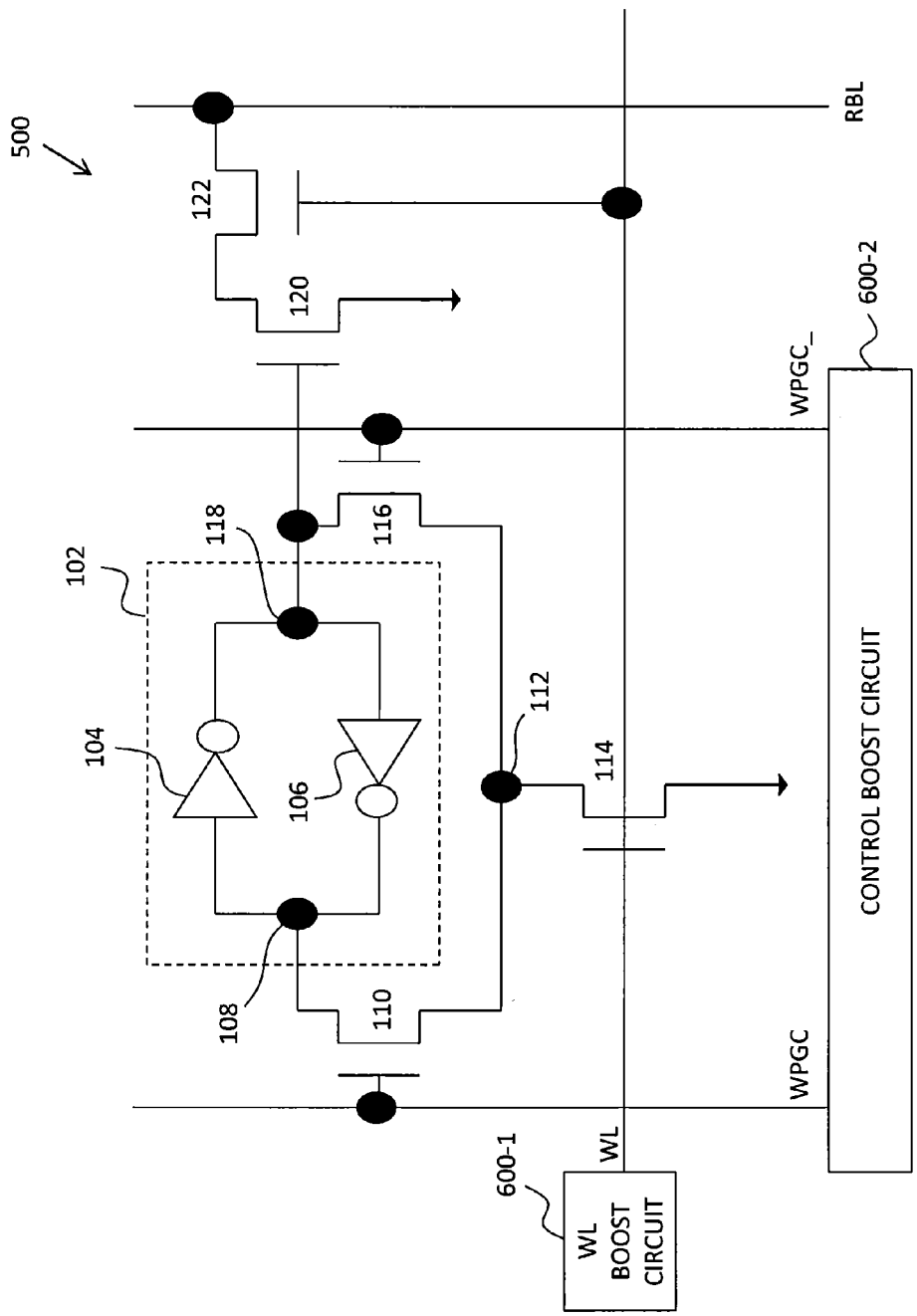
FIG. 5 illustrates another example of an SRAM memory cell configured with a booster circuit.
Figure 6:
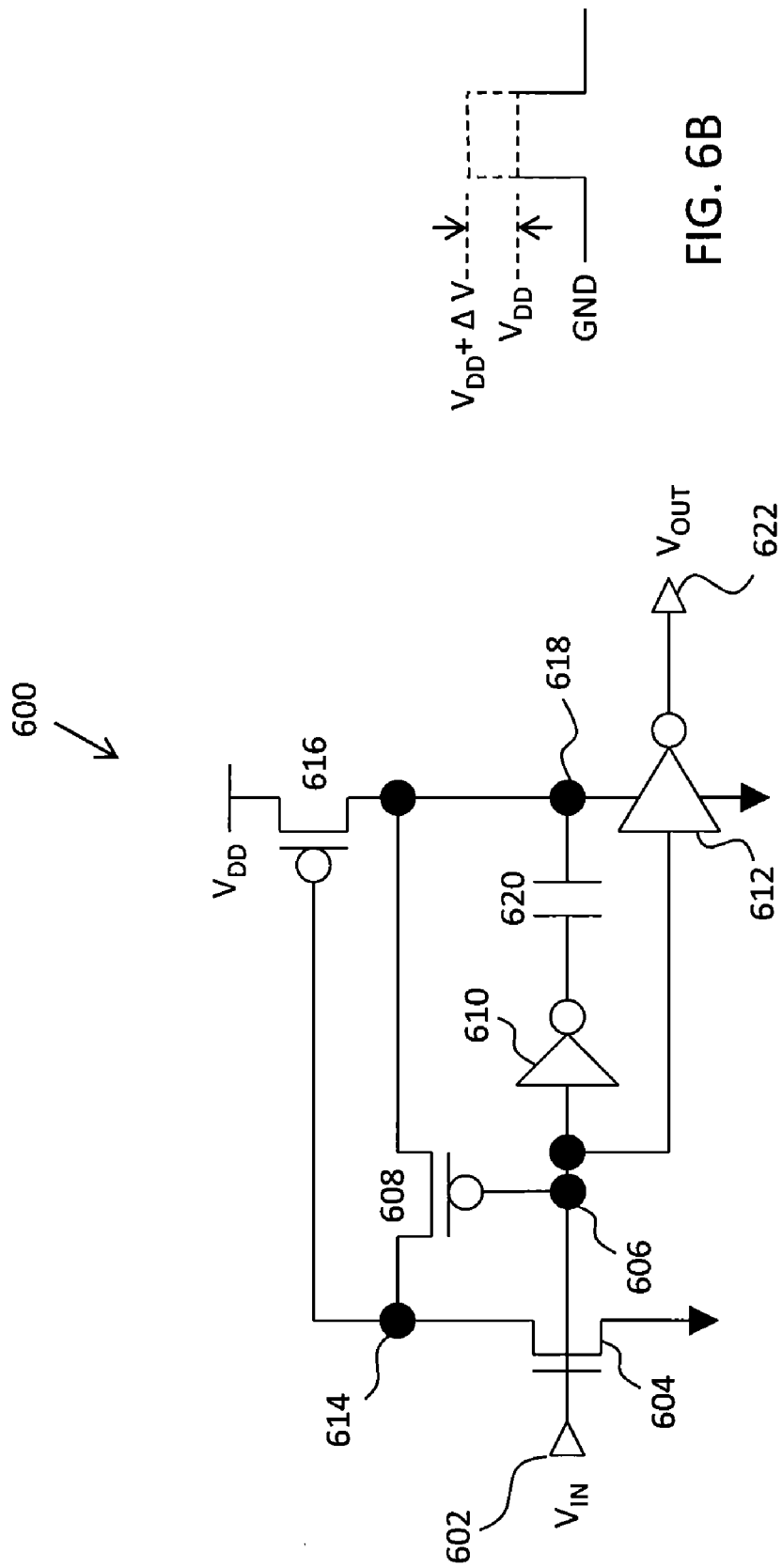
FIG. 6A illustrates one example of a booster circuit that may be implemented with the SRAM memory cell illustrated in FIG. 5.
FIG. 6B is a timing diagram of the booster circuit in FIG. 6A.

The write margin of the improved SRAM cell may be increased using boosting circuits 600-1, 600-2 (collectively referred to as "boosting circuit 600") coupled the WL and/or control lines WPGC and WPGC as illustrated in FIG. 5. FIG. 6A illustrates one example of a boosting circuit 600 that may be implemented to enhance the write margin of an SRAM cell. As shown in FIG. 6A, boosting circuit 600 includes an input node 602 coupled to the gate of a first transistor 604 and to node 606, which is coupled to a gate of a second transistor 608 and to the input of inverters 610 and 612.

The source of transistor 604 is coupled to node 614, which is coupled to the source of PMOS transistor 608 and the gate of p-type transistor 616. The output of inverter 610 is coupled to node 618 through capacitor 620. Node 618 is coupled to inverter 612 and to the drain of transistor 616, which has its gate coupled to the operating voltage $V_{DD}$. The output of transistor 612 is coupled to the output node 622. In operation, capacitor 620 of booster circuit 600 charges and discharges to increase the voltage at node 618 above the operating voltage $V_{DD}$ as shown in FIG. 6B where $\Delta V$ is the voltage provided by capacitor 620.

The use of a boosting circuit 600 to increase the voltage of the WL and/or control lines WPGC, WPGC_ improves the write margin by respectively increasing the speed at which transistors 114 and 110, 116 turn on. Additionally, increasing the voltage of WL and control lines WPGC, WPGC_ helps to ensure that transistors 114 and 110, 116 are turned on at appropriate times. Put another way, increasing the voltages of WL and control lines WPGC, WPGC_ helps to ensure that data is not inadvertently written to or read from an SRAM cell, especially during $V_{CCmin}$ operation.

Figure 7:
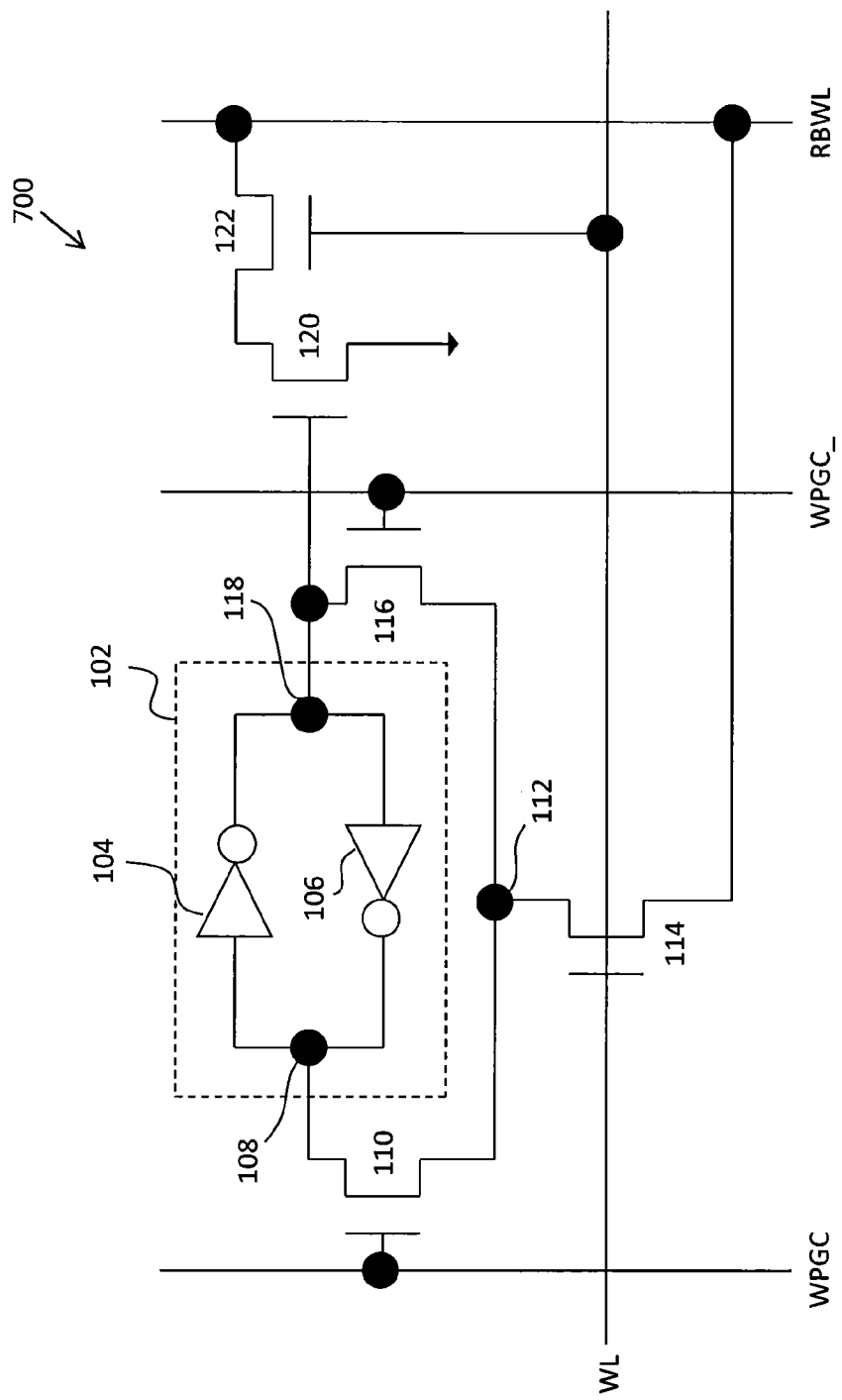
FIG. 7 illustrates another example of an SRAM memory cell.

FIG. 7 illustrates another example of an SRAM cell 700 having a similar, but not identical structure, to SRAM cell 100. The difference between SRAM cell 100 and SRAM cell 700 is that the drain of transistor 114 is coupled to read-write bit line, RBWL, instead of to ground. The accessing of SRAM cell 700 (i.e., the reading of data from and writing of data to SRAM cell 700) is similar to the accessing of SRAM 100.

Figure 8A:
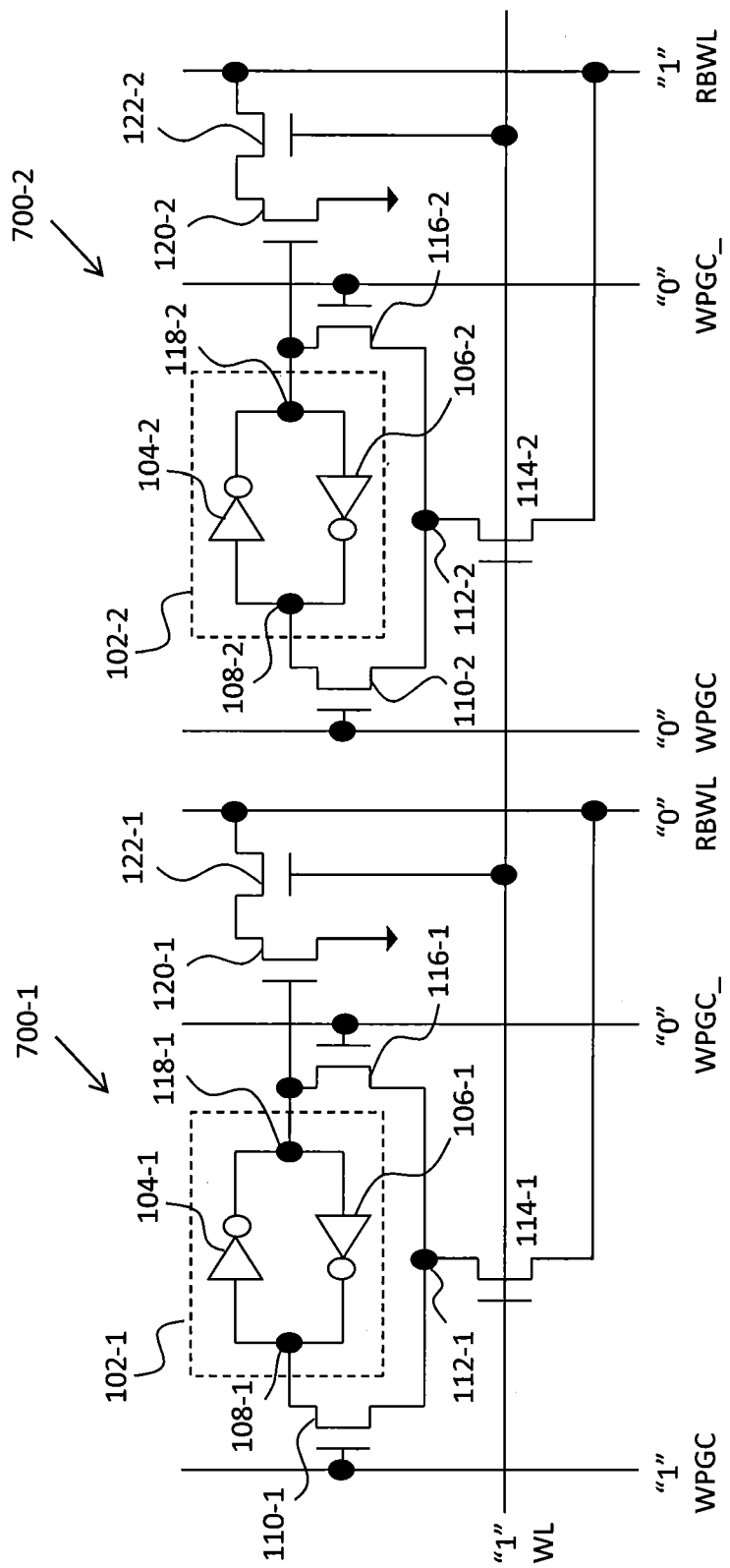
FIG. 8A illustrates an SRAM memory cell in accordance with FIG. 7 during a read operation.

For example, writing a logic one to node 108-1 includes setting WL and line WPGC to logic ones at blocks 802 and 804, respectively, as illustrated in FIGS. 8A and 8B. Control line WPGC_ is set to a logic zero at block 806. With WL and WPGC providing high voltages to the respective gates of transistors 114-1 and 110-1, transistors 114-1 and 110-1 are turned on. The low voltage provided by WPGC_ to the gate of transistor 116-1 turns off transistor 116-1 such that node 118-1 is isolated from node 112-1, which is coupled to RBWL since transistor 114-1 is on. Line RBWL coupled to SRAM cell 300-1 provides a low voltage, i.e., a logic zero, which is then stored in node 108-1 via transistors 114-1 and 110-1.

SRAM cell 700-2 is isolated from the write operation to SRAM cell 700-2 by providing logic zeroes on write control lines WPGC and WPGC_. With control lines WPGC and WPGC_ low, transistors 110-2 and 116-2 are in an off state such that SRAM cell 300-2 is not affected by half-selection disturbance.

Figure 9A:
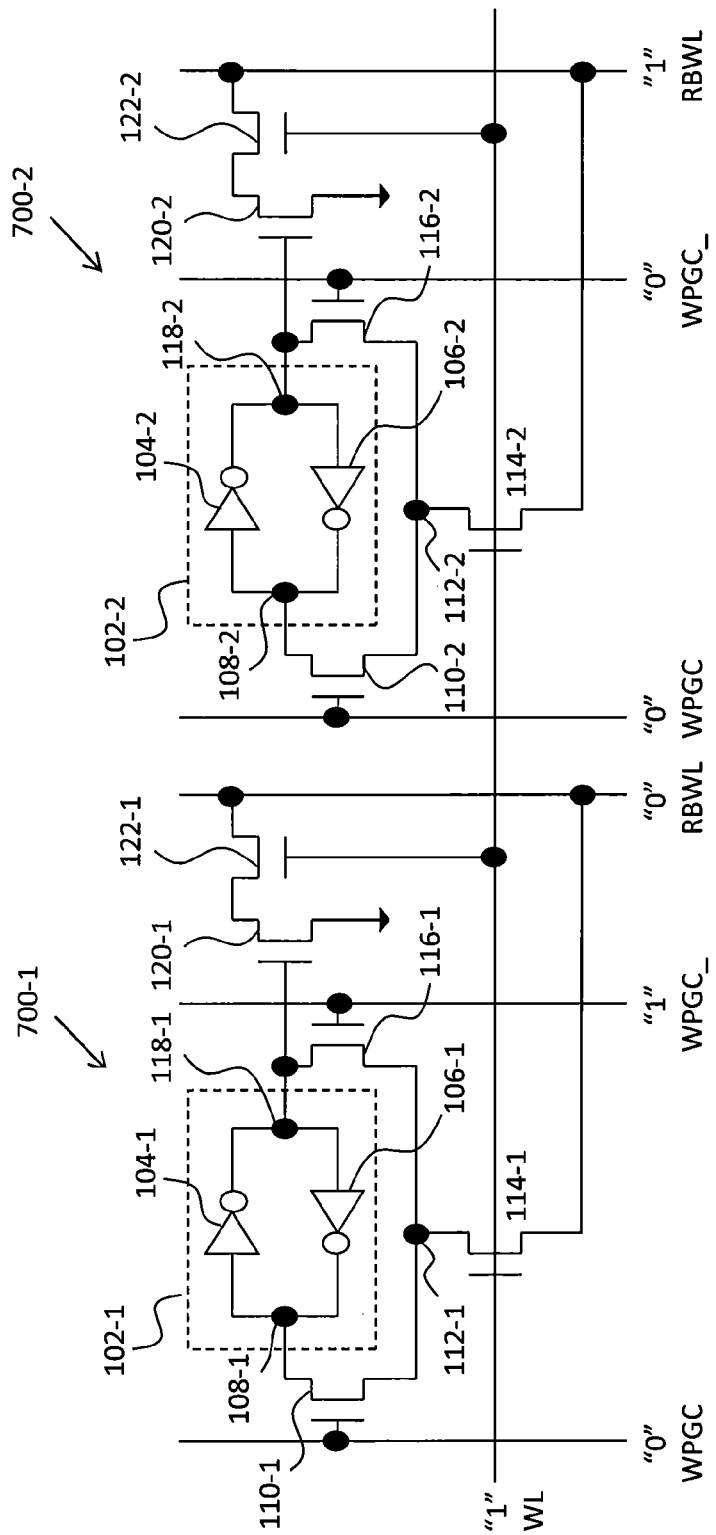
FIG. 9A illustrates an SRAM memory cell in accordance with FIG. 7 during another read operation.

A logic one can be written to node 108-1 of SRAM cell 700-1 by setting WL at block 902, control line WPGC_ to high at block 904, and control line WPGC and RBWL to low at blocks 906 and 908, respectively, as illustrated in FIGS. 9A and 9B. Line WPGC_ set to logic one turns on transistor 116-1, and transistor 114-1 is turned on due to WL being set to logic one resulting in node 118-1 being coupled to RBWL through transistors 116-1 and 114-1. With RBWL being set to zero, node 118-1 transitions to a logic zero causing node 108-1 to transition to a logic one. Node 108-1 is decoupled from node 112-1 RBWL since write control line WPGC is set at zero.

SRAM cell 700-2 can be isolated during the writing to SRAM cell 700-1 by setting the control lines WPGC and WPGC_ coupled to SRAM cell 300-2 to zero, which results in transistors 110-2 and 116-2 being off. The isolation of SRAM cell 300-2 advantageously reduces half-selection disruption to SRAM cell 700-2.

Figure 10A:
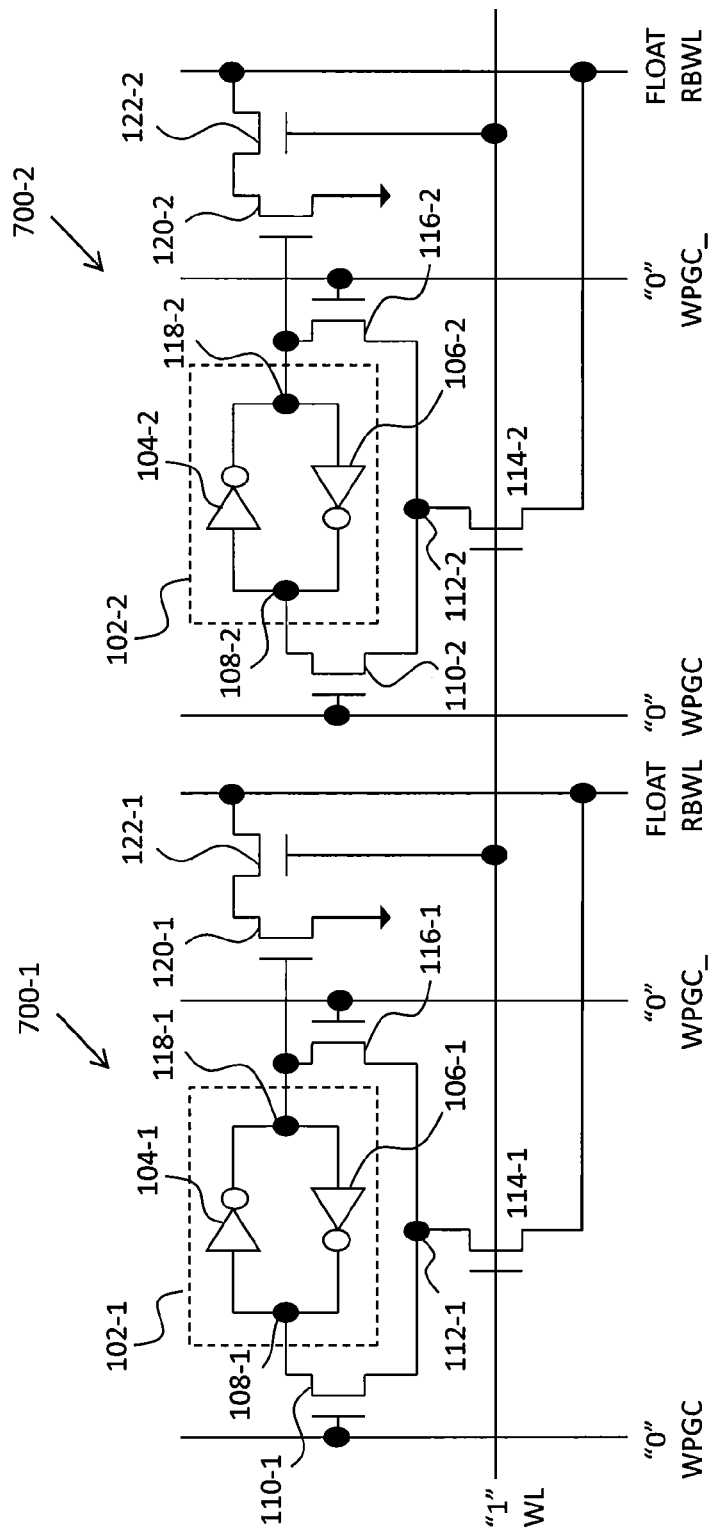
FIG. 10A illustrates an SRAM memory cell in accordance with FIG. 7 during a write operation.

FIG. 10A illustrates SRAM cells 700-1 and 700-2 during a reading of a zero from node 108-1, and FIG. 10B is a flow chart for one example of a method 1000 of reading a zero from node 108-1 in accordance with FIG. 10A. The reading operation is performed by setting line WL to a logic one at block 1002, which turns on transistors 114-1, 114-2 and 122-1, 122-2. At blocks 1004 and 1006, a logic zero is applied to control lines WPGC and WPGC_, which turns off transistors 110-1 and 116-1. With a logic one stored at node 108-1, node 118-1 is set at logic one due to inverter 104-1. The logic one at node 118-1 turns on transistor 120-1 resulting in RBWL being coupled to ground through transistors 120-1 and 122-1.

Figure 11:
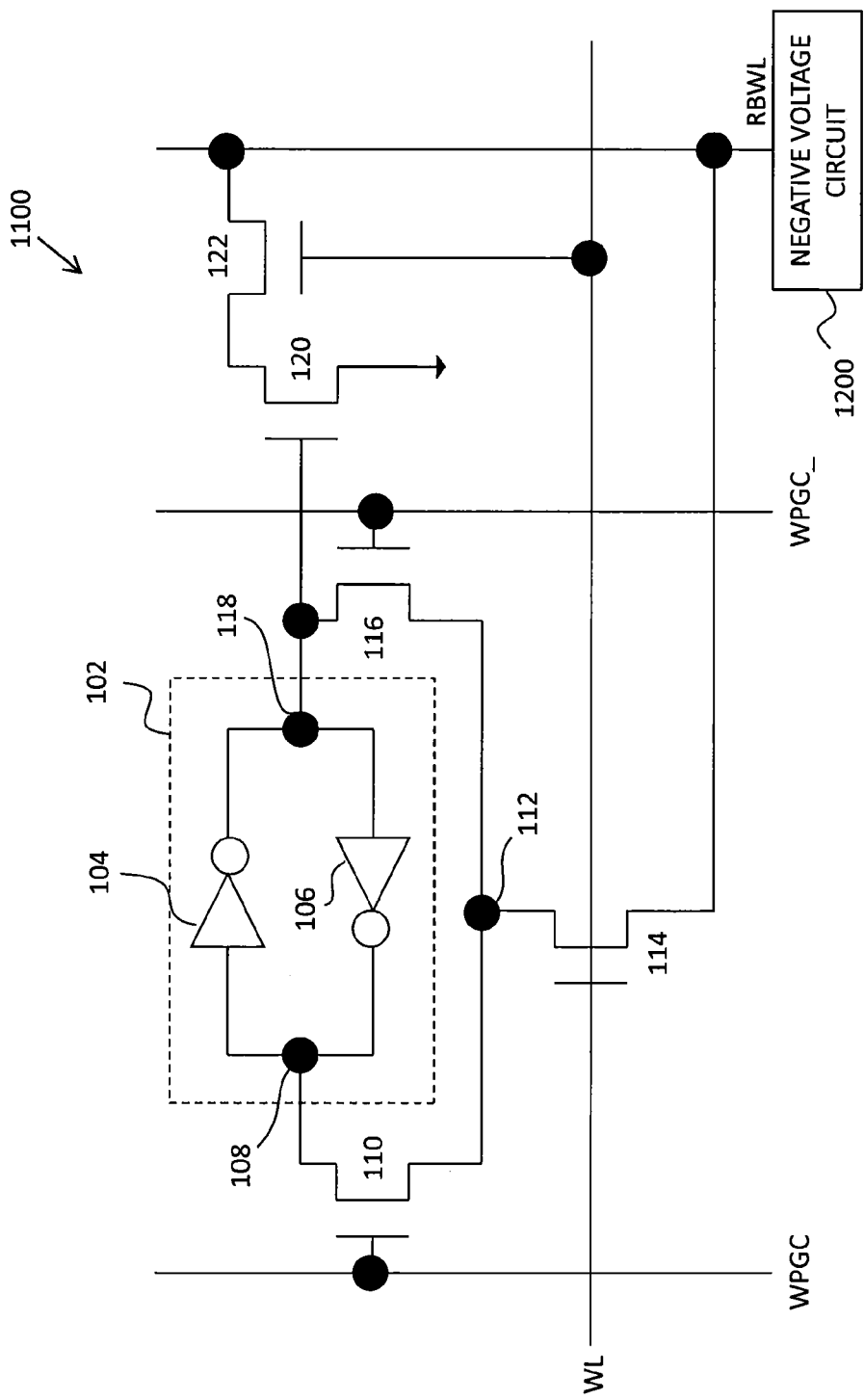
FIG. 11 illustrates another example of an SRAM memory cell configured with a negative voltage generation circuit.
Figure 12A:
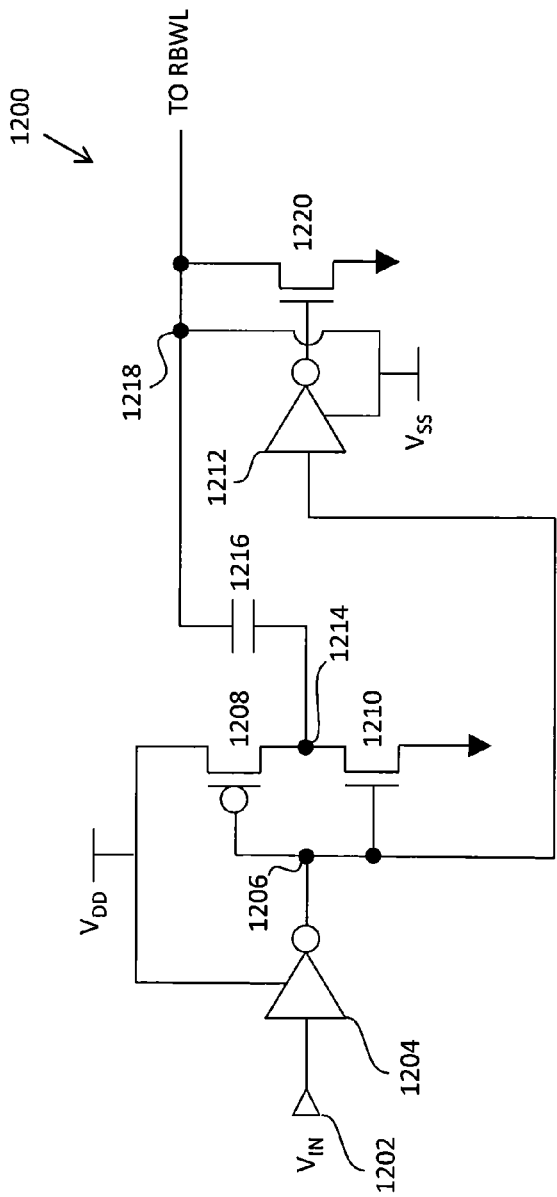
FIG. 12A illustrates one example of a negative voltage generation circuit that may be implemented with the SRAM memory cell illustrated in FIG. 11.

In some embodiments, a negative voltage generation circuit 1200 may be coupled to RBWL as shown in FIG. 11 to improve the write margin during a write operation. FIG. 12A illustrates one example of a negative voltage generation circuit 1200 that may be implemented to improve the gain margin of an SRAM cell 1100 during a write operation. As shown in FIG. 12A, negative voltage circuit 1200 includes an input node 1202 coupled to the input of an inverter 1204, which has its output connected to node 1206. Node 1206 is coupled to the gates of transistors 1208 and 1210 and to the input of inverter 1212. PMOS transistor 1208 has its source coupled to the operating voltage, $V_{DD}$, and its drain coupled to the source of NMOS transistor 1210 at node 1214. Node 1214 is coupled to capacitor 1216, which is coupled to the RBWL at node 1218. Node 1218 is also coupled to low voltage supply $V_{SS}$. Inverter 1212 has its output coupled to the gate of transistor 1220, which has its drain coupled to ground and its source coupled to node 1218.

Figure 12B:
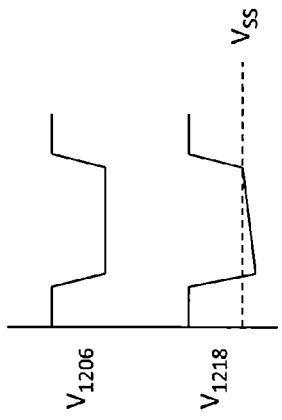
FIG. 12B is a timing diagram of the negative voltage generation circuit illustrated in FIG. 12A.

In operation, capacitive coupling between RBWL and capacitor 1216 causes RBWL to have a negative pulse as shown in FIG. 12B. The negative pulse provided to RBWL by negative voltage generator 1200 improves the write margin of SRAM cell 1100 increasing the voltage difference between RBWL and $V_{DD}$. The increased voltage difference between RBWL and $V_{DD}$ enables the writing of a logic zero to nodes 108 and/or 118 to be achieved faster than if RBWL is only set at $V_{SS}$.

In some embodiments, a semiconductor memory bit cell includes a latch having a pair of cross-coupled inverters. A first transistor has a gate coupled to a first control line and a source coupled to the latch, and a second transistor has a gate coupled to a second control line and a drain coupled to the drain of the first transistor at a first node. A third transistor has a source coupled to the first node and a gate coupled to a word line, and a fourth transistor has a gate coupled to a source of the second transistor and to the latch. A fifth transistor has a gate coupled to the word line and a drain coupled to a read bit line.

In some embodiments, a method of accessing a semiconductor bit cell includes receiving a first voltage level at a first control line coupled to a gate of a first pass transistor, and receiving a second voltage level at a second control line coupled to a gate of a second pass transistor. The first and second pass transistors are coupled to a latch configured to store a bit of data. A third voltage level is received at a word line to turn on third and fourth transistors. The third transistor is coupled to a bit line and to a fifth transistor, and the fourth transistor is coupled to the first and second transistors and to at least one of a ground node or to the bit line.

In some embodiments, a semiconductor memory bit cell includes a first transistor having a source coupled to an input of a first inverter and to an output of a second inverter, a gate coupled to a first control line, and a drain coupled to a first node. A second transistor has a source coupled to an output of the first inverter and to an input of the second inverter, a gate coupled to a second control line, and a drain coupled to the first node. A third transistor has a gate coupled to a word line and a source coupled to the first node. A fourth transistor has a gate coupled to the source of the second transistor and a drain coupled to ground. A fifth transistor has a gate coupled to the word line, a source coupled to a bit line, and a drain coupled to a source of the fourth transistor.

The improved SRAM cells disclosed herein exhibit improved current performance and operating speed, even for $V_{CCmin}$ operation. Additionally, the improved SRAM cells do not suffer from half-selected disturbance.

Although the disclosed circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A semiconductor memory bit cell, comprising:
    a latch including a pair of cross-coupled inverters;
    a first transistor having a gate coupled to a first control line and a source coupled to the latch;
    a second transistor having a gate coupled to a second control line and a drain coupled to the drain of the first transistor at a first node;
    a third transistor having a source coupled to the first node and a gate coupled to a word line;
    a fourth transistor having a gate coupled to a source of the second transistor and to the latch; and
    a fifth transistor having a gate coupled to the word line and a drain coupled to a read bit line.

2. The semiconductor memory bit cell of claim 1, wherein the third transistor has a drain coupled to ground.

3. The semiconductor memory bit cell of claim 1, wherein the third transistor has a drain coupled to the read bit line.

4. The semiconductor bit cell of claim 1, wherein the first and second control lines and the first and second transistors are configured to isolate the latch during a read operation.

5. The semiconductor bit cell of claim 1, wherein the word line is coupled to a boosting circuit configured to increase a voltage of the word line.

6. The semiconductor bit cell of claim 1, wherein the first and second control lines are coupled to a boosting circuit configured to increase a voltage on the first and second control lines.

7. A method of accessing a semiconductor bit cell, comprising:
    receiving a first voltage level at a first control line coupled to a gate of a first pass transistor;
    receiving a second voltage level at a second control line coupled to a gate of a second pass transistor, the first and second pass transistors coupled to a latch configured to store a bit of data; and
    receiving a third voltage level at a word line to turn on third and fourth transistors, the third transistor coupled to a bit line and to a fifth transistor, and the fourth transistor coupled to the first and second transistors and to at least one of a ground node or to the bit line.

8. The method of claim 7, wherein the first and second voltage levels are low voltage levels such that the first and second transistors are in an off state, and the third voltage level is a high voltage level relative to the first and second voltage levels such that the third and fourth transistors are in an on state to couple the read bit line to ground through the third and fifth transistors.

9. The method of claim 7, wherein the first and third voltage levels are high voltage levels such that the first, third, and fourth transistors are in an on state, and the second voltage level is a low voltage level such that the second transistor is an off state.

10. The method of claim 9, further comprising receiving a low voltage level to the bit line to transition a node coupled to a source of the first transistor to have a low voltage.

11. The method of claim 9, wherein a node coupled to a source of the first transistor is connected to ground through the first and fourth transistors such that the node has a low voltage.

12. The method of claim 7, wherein the second and third voltage levels are high voltage levels such that the second, third, and fourth transistors are turned on, and the first voltage level is a low voltage level relative to the second and third voltage levels such that the first transistor is turned off.

13. The method of claim 12, wherein a node coupled to the source of the second transistor is coupled to ground through the second and fourth transistors.

14. The method of claim 12, further comprising receiving a low voltage level to the bit line such that a node coupled to a source of the second transistor has a low voltage.

15. A semiconductor memory bit cell, comprising:
    a first transistor having a source coupled to an input of a first inverter and to an output of a second inverter, a gate coupled to a first control line, and a drain coupled to a first node;
    a second transistor having a source coupled to an output of the first inverter and to an input of the second inverter, a gate coupled to a second control line, and a drain coupled to the first node;
    a third transistor having a gate coupled to a word line and a source coupled to the first node;
    a fourth transistor having a gate coupled to the source of the second transistor and a drain coupled to ground; and
    a fifth transistor having a gate coupled to the word line, a source coupled to a bit line, and a drain coupled to a source of the fourth transistor.

16. The semiconductor memory bit cell of claim 15, wherein a drain of the third transistor is coupled to ground.

17. The semiconductor memory bit cell of claim 15, wherein a drain of the third transistor is coupled to the bit line.

18. The semiconductor memory bit cell of claim 17, wherein the bit line is coupled to a negative voltage generator configured to provide a negative voltage with respect to ground to the bit line.

19. The semiconductor memory bit cell of claim 15, wherein the first and second control lines and the first and second transistors are configured to isolate the inverter latch during a read operation.

20. The semiconductor bit cell of claim 15, wherein the word line is coupled to a boosting circuit configured to increase a voltage of the word line to have a magnitude greater than a magnitude of the operating voltage of the semiconductor bit cell.

* * * * *